(12) United States Patent
Misner et al.

(10) Patent No.: US 6,421,911 B1
(45) Date of Patent: Jul. 23, 2002

(54) APPARATUS AND METHOD FOR PROVIDING AUTOMATIC ALIGNMENT OF A CIRCUIT BOARD WITHIN A CHASSIS

(75) Inventors: Chad E. Misner, Arlington Heights, IL (US); Michael J. Giovannoni, Great Falls, VA (US)

(73) Assignee: 3Com Corporation, Rolling Meadows, IL (US)

( * ) Notice: Subject to any disclaimer, the term of this patent is extended or adjusted under 35 U.S.C. 154(b) by 0 days.

(21) Appl. No.: 09/450,960

(22) Filed: Nov. 30, 1999

(51) Int. Cl.⁷ ................................................. H01R 9/00
(52) U.S. Cl. .................. 29/842; 29/759; 29/760; 29/830; 361/752; 361/753; 361/785
(58) Field of Search ................... 29/830, 759, 760; 361/752, 753, 785, 790

(56) References Cited

U.S. PATENT DOCUMENTS

| | | | | |
|---|---|---|---|---|
| 3,939,382 A | * | 2/1976 | Lacan et al. | |
| 5,065,141 A | * | 11/1991 | Whitsitt | |
| 5,680,294 A | * | 10/1997 | Stora et al. | |
| 5,791,042 A | * | 8/1998 | Baum et al. | 29/760 |
| 6,131,274 A | * | 10/2000 | Koradia et al. | 29/759 |

* cited by examiner

Primary Examiner—Carl J. Arbes
(74) Attorney, Agent, or Firm—Baniak Pine & Gannon

(57) ABSTRACT

An apparatus for providing automatic alignment of a circuit board within a chassis includes a housing member having an end wall portion. The end wall portion includes a plurality of openings formed therein for receiving a plurality of connectors. The end wall portion further includes a first raised portion and a second raised portion to provide automatic alignment of the circuit board within the chassis.

25 Claims, 3 Drawing Sheets

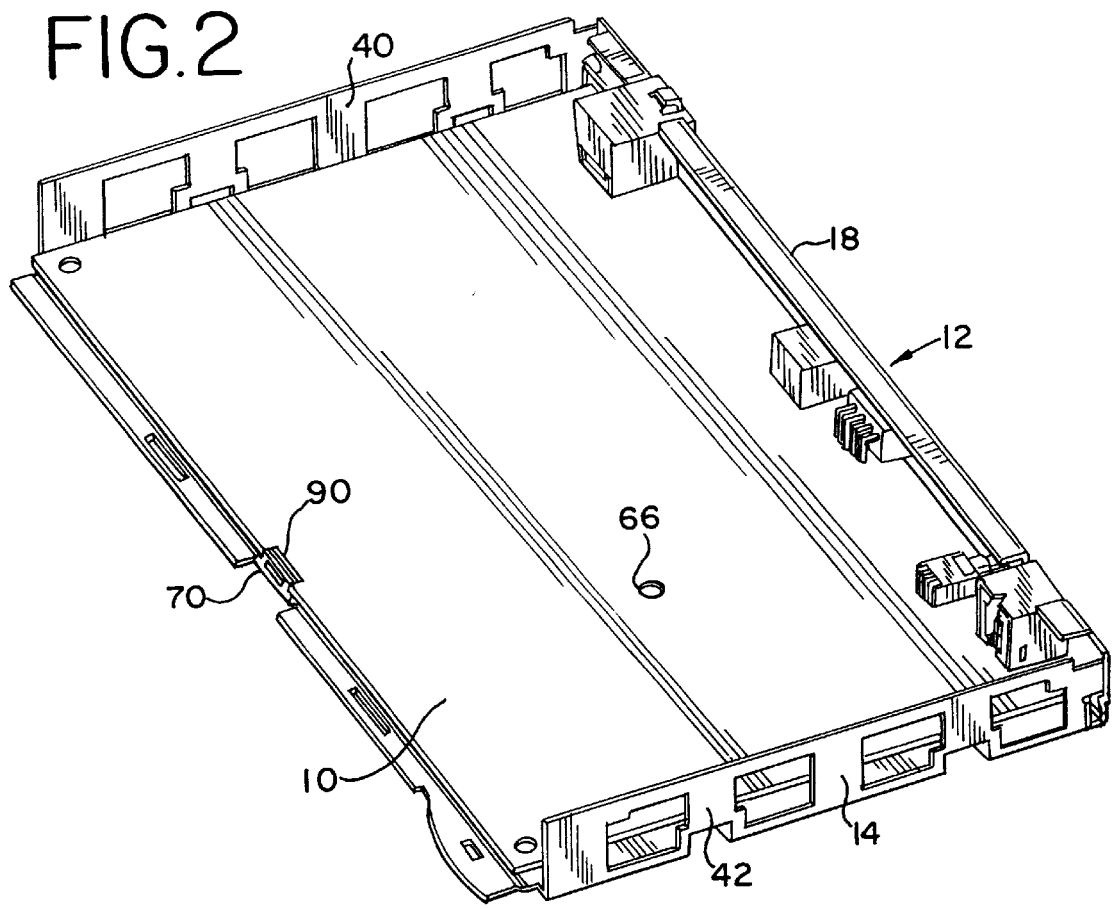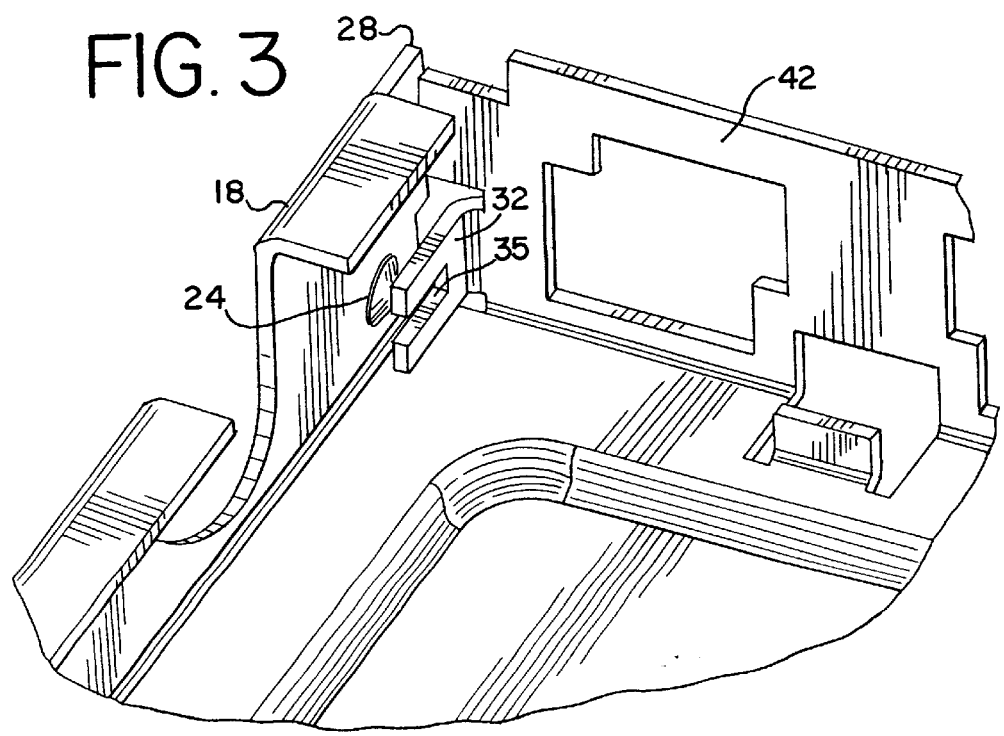

APPARATUS AND METHOD FOR PROVIDING AUTOMATIC ALIGNMENT OF A CIRCUIT BOARD WITHIN A CHASSIS

FIELD OF THE INVENTION

This invention relates generally to the field of electronic chassis and in particular, to an apparatus and method for providing automatic alignment of a circuit board within a chassis.

BACKGROUND OF THE INVENTION

Electronic devices such as modems and routers typically include a circuit board mounted within a metal chassis. The metal chassis typically include a plurality of openings (or cutouts) that are positioned along a rear wall of the chassis to allow input/output connectors that are surface mounted to the circuit board to extend into the cutouts. This allows a technician to access the various input/output connectors. The circuit board is typically fastened to the chassis with a fastener such as a screw or bolt that extends through a fastener opening in the circuit board and a fastener opening in a bottom wall of the chassis.

To fasten the circuit board to the chassis, the circuit board is slidably positioned onto the inside surface of the bottom wall of the chassis so that the back edge of the circuit board contacts the rear wall of the chassis. The circuit board typically includes a locator notch located along the front edge of the board that mates with a locator tab located along the front edge of the chassis. The circuit board then has to be manually oriented with respect to the chassis so that the fastener opening in the circuit board aligns with the fastener opening in the bottom wall of the chassis. Proper alignment of the circuit board ensures that the input/output connectors are properly oriented relative their respective cutouts in the rear wall of the chassis.

There are several disadvantages associated with attempting to align the circuit board with the chassis manually. Oftentimes, the circuit board will slide too far into the chassis. As a result, the fastener opening in the circuit board does not line up with the fastener opening in the bottom wall of the chassis. If this happens, the locator notch along the front edge of the circuit board may not engage the locator tab on the chassis. Moreover, the input/output connectors may be pushed too far out beyond their respective cutouts.

Attempts have made to provide a gasket between the rear wall of the chassis and the back edge of the circuit board. However, the gaskets themselves add significant costs to the chassis. Moreover, they must be installed manually, which is a very labor intensive process, which also results in increased costs.

Attempts have also been made to use input/output connectors that are adapted to be mounted flush with the rear wall of the chassis. However, oftentimes the circuit board will include a wide variety of input/output connectors having various depths that are not adaptable to be mounted flush with the rear wall of the chassis.

Accordingly, it would be desirable to have an apparatus and method for automatically orienting a circuit board within a chassis that overcomes the disadvantages described above.

SUMMARY OF THE INVENTION

One aspect of the invention provides an apparatus for providing automatic alignment of a circuit board within a chassis including a housing member having an end wall portion. The end wall portion includes a plurality of openings formed therein for receiving a plurality of connectors. The end wall portion further includes a first raised portion and a second raised portion to provide automatic alignment of the circuit board within the chassis. The first raised portion may preferably be positioned adjacent a first end of the end wall portion and the second raised portion may preferably be positioned adjacent to a second end of the end wall portion. The first and second raised portions may each preferably have a circular shape and may extend inward into the housing member. The housing member may further include a first flange portion including an opening formed therein which is aligned with the first raised portion and a second flange portion including an opening formed therein which is aligned with the second raised portion to receive and guide the circuit board. The opening in the first flange portion may be comprised of a slot and the opening in the second flange portion may also be comprised of a slot. The housing member may further include a first sidewall portion and a second sidewall portion. The first flange portion may extend preferably outward substantially perpendicular from the first sidewall portion and the second flange portion may preferably extend outward substantially perpendicular from the second sidewall portion. The first flange portion may preferably be positioned adjacent to an end of the first sidewall portion and the second flange portion may preferably be positioned adjacent to an end of the second sidewall portion. The first and second sidewall portions may each preferably include a plurality of openings formed therein. The housing member may further include a third raised portion extending from a bottom wall portion of the housing member. The third raised portion may preferably include an opening formed therein for receiving a fastener to secure the circuit board to the housing member. The fastener may preferably be a screw. The third raised portion may preferably have a circular shape and may extend inward into the housing member. The housing member may preferably include an alignment tab portion to align the circuit board with the housing member. The alignment tab portion may preferably be positioned along a front edge portion of the housing member. The alignment tab portion may preferably extend outward substantially perpendicular from a bottom wall portion of the housing member. The circuit board may preferably include a notch portion, and the alignment tab portion may preferably be received in the notch portion. The notch portion may preferably be positioned along a second end of the circuit board. The circuit board may preferably be fastened to the housing member. The housing member may preferably be comprised of a single piece of conductive material.

Another aspect of the invention provides an apparatus for providing automatic alignment of a circuit board including a housing member having an end wall portion. The end wall portion includes a plurality of openings formed therein for receiving a plurality of connectors. The end wall portion further includes a first raised portion and a second raised portion. The first raised portion is positioned adjacent a first end of the end wall portion and the second raised portion is positioned adjacent a second end of the end wall portion. A circuit board including a first end is positioned within the chassis. The first end of the circuit board contacts the first and second raised portions to provide automatic alignment of the circuit board within the chassis.

Another aspect of the invention provides a method of providing automatic alignment of a circuit board within a chassis. A housing member including an end wall portion is provided. The end wall portion includes a plurality of openings formed therein for receiving a plurality of connectors. The end wall portion further includes a first raised portion and a second raised portion. A circuit board including a first end is also provided. The circuit board is positioned into the chassis, and the first end of the circuit board is contacted with the first and second raised portions to provide automatic alignment of the circuit board within the chassis. The housing member may also preferably include a first flange portion having an opening aligned with the first raised portion and a second flange portion having an opening aligned with the second raised portion. The first end of the circuit board may preferably be inserted through the opening in the first flange portion and through the opening in the second flange portion to guide the circuit board. The circuit board may preferably be fastened to the housing member.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 2 is the embodiment of FIG. 1 showing the circuit board mounted to the chassis;

FIG. 3 is an enlarged partial view of the embodiment of FIG. 1 showing the second raised portion;

DETAILED DESCRIPTION OF THE PRESENTLY PREFERRED EMBODIMENTS

Figure 1:
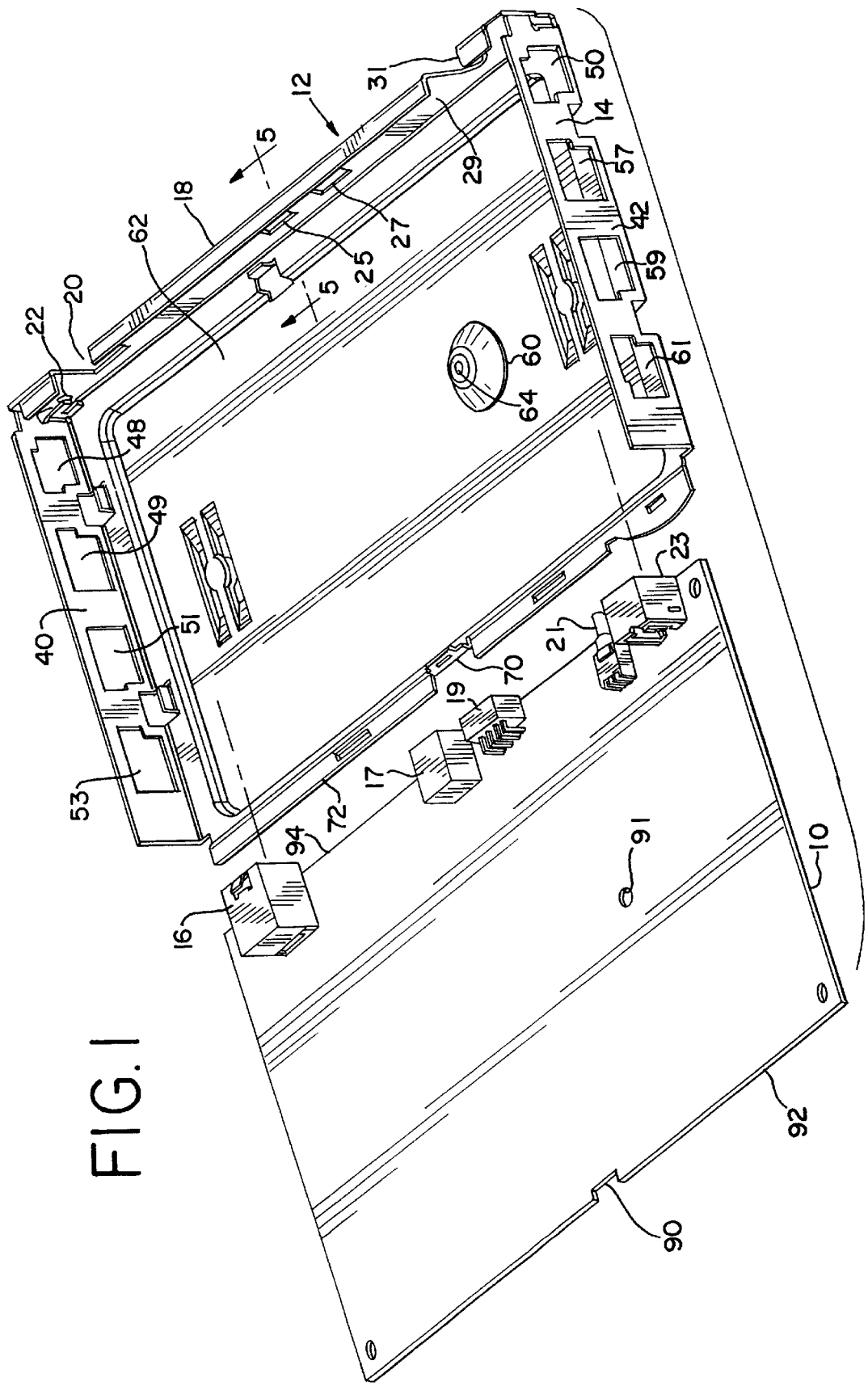
FIG. 1 is a perspective view of a preferred embodiment of an apparatus for providing automatic alignment of a circuit board within a chassis that is made in accordance with the invention. The circuit board is shown exploded from the chassis.

Referring to FIGS. 1–2, a preferred embodiment of an apparatus for providing automatic alignment of a circuit board 10 within a chassis 12 includes a housing member 14. As shown in FIGS. 1–2, the housing member 14 may preferably have a generally rectangular shape and may preferably be adapted to house the circuit board 10, which also may preferably have a generally rectangular shape. The housing member 14 may preferably be comprised of a single piece of conductive material such as, for example, steel, aluminum, or any other suitable metallic material. The chassis 12 may preferably be any suitable enclosure for housing various electronic components. The chassis 12 may preferably be a chassis for housing, for example, an office modem or router.

The circuit board 10 may preferably be any conventional printed circuit board. As shown in the embodiment of FIG. 1, the circuit board 10 may preferably include a plurality of conventional connectors 16, 17, 19, 21, 23 mounted to the circuit board 10. The connectors 16, 17, 19, 21, 23 may preferably include, for example, various input and output connectors.

Referring to FIGS. 1–6, the housing member 14 includes an end wall portion 18. In the embodiment shown, the end wall portion 18 is integrally formed with the housing member 14. Alternatively, the end wall portion 18 may be a separate member. As shown in FIG. 1, the end wall portion 18 includes a plurality of openings 20, 25, 27, 29, 31 formed therein for receiving the plurality of connectors 16, 17, 19, 21, 23 mounted on the circuit board 10.

Referring to FIGS. 1, and 3–6, the end wall portion 18 further includes a first raised portion 22 and a second raised portion 24. The first and second raised portions 22 and 24 provide automatic alignment of the circuit board 10 within the chassis 12.

Figure 4:
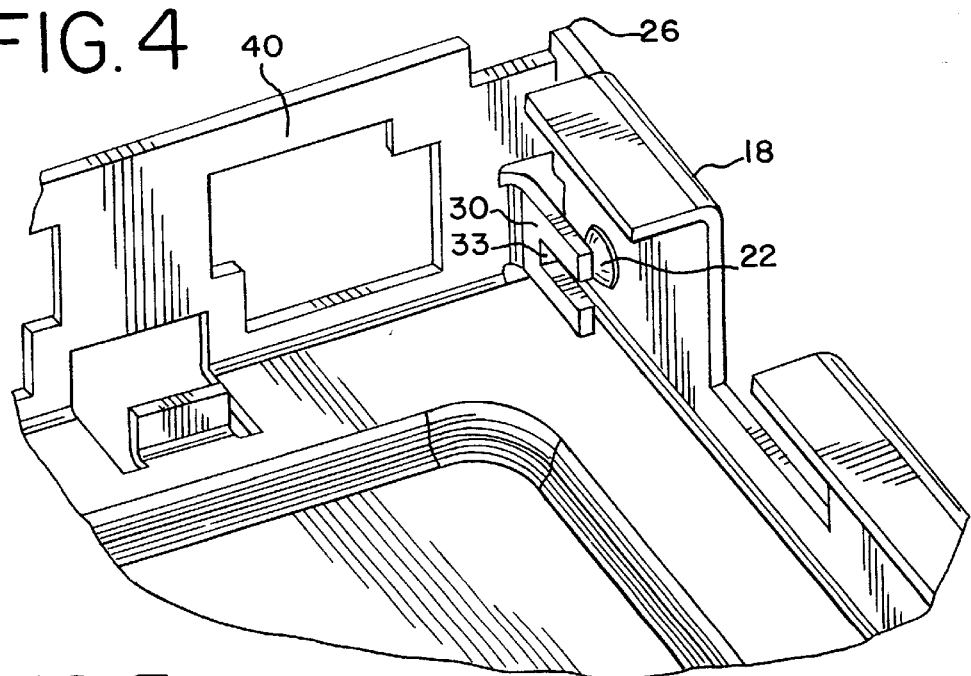
FIG. 4 is an enlarged partial view of the embodiment of FIG. 1 showing the first raised portion.
Figure 5:
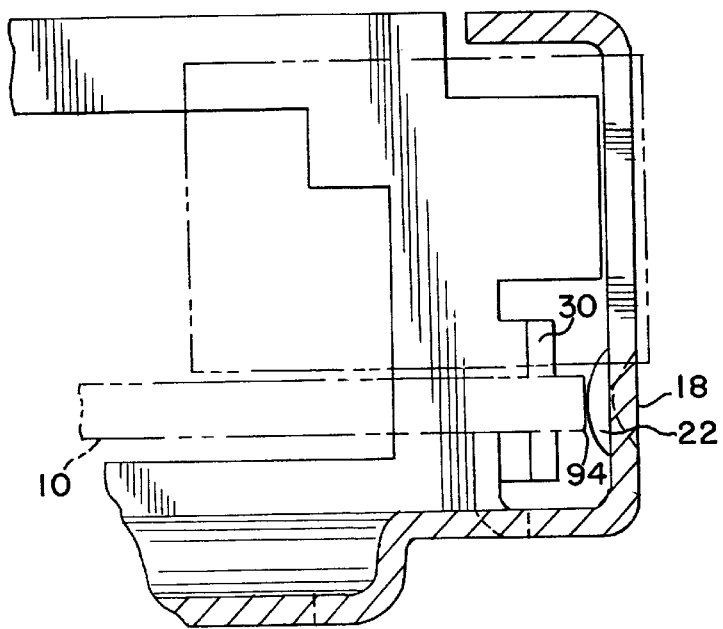
FIG. 5 is a sectional view taken along line 5—5 of FIG. 1.
Figure 6:
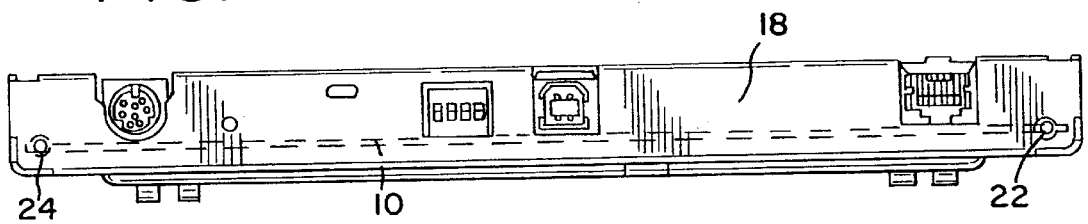
FIG. 6 is an end view of the embodiment of FIG. 2.

Referring to FIGS. 3 and 4, the first raised portion 22 may preferably be positioned adjacent a first end 26 of the end wall portion 18 and the second raised portion 24 may preferably be positioned adjacent to a second end 28 of the end wall portion 18. In the embodiment shown, the first and second raised portions 22, 24 each have a circular shape, although other shapes and configurations are contemplated. The first and second raised portions 22, 24 each may extend inward into the interior of the housing member 14. The raised portions 22, 24 may be formed by any conventional technique. For example, the raised portions 22, 24 may preferably be tooled into the end wall portion 18 by any of the conventional stamping methods.

Referring to FIG. 4, the housing member 14 may further include a first flange portion 30 including an opening 33 formed therein. In the embodiment shown, the first flange portion 30 is integrally formed with the housing member 14. Alternatively, the first flange portion 30 may be a separate member. The opening 33 may preferably be aligned with the first raised portion 22.

Referring to FIG. 3, the housing member 14 may also include a second flange portion 32 including an opening 35 formed therein. In the embodiment shown, the second flange portion 32 is integrally formed with the housing member 14. Alternatively, the second flange portion 32 may be a separate member. The opening 35 may preferably be aligned with the second raised portion 24. The openings 33, 35 in the flange portions 30, 32 receive and guide the circuit board 10 to the first and second raised portions 22 and 24. The opening 33 in the first flange portion 30 may preferably be configured as an open ended slot. Similarly, the opening 35 in the second flange portion 32 may preferably be configured as an open ended slot. However, other shapes and configurations for the openings 33, 35 are contemplated.

Referring to FIGS. 1–2, the housing member 14 may preferably include a first sidewall portion 40 and a second sidewall portion 42. Referring to FIGS. 3 and 4, the first flange portion 30 may preferably extend outward substantially perpendicular from the first sidewall portion 40, and the second flange portion 32 may preferably extend outward substantially perpendicular from the second sidewall portion 42. The first flange portion 30 may preferably be positioned adjacent to an end 44 of the first sidewall portion 40 and the second flange portion 32 may preferably be positioned adjacent to an end 46 of the second sidewall portion 42.

Referring again to FIGS. 1 and 2, the first sidewall portion 40 may preferably include a plurality of openings 48, 49, 51, 53 formed therein. Similarly, the second sidewall portion 42 may preferably include a plurality of openings 50, 57, 59, 61 formed therein. In the embodiment shown, the first and second sidewall portions 40 and 42 are each integrally formed with the housing member 14. Alternatively, the first and second sidewall portions 40 and 42 may each be a separate members.

Referring to FIG. 1, the housing member 14 may further include a third raised portion 60 extending from a bottom wall portion 62 of the housing member 14. The third raised portion 60 may preferably include an opening 64 formed therein for receiving a fastener 66 (see FIG. 2) to secure the circuit board 10 to the housing member 14. The fastener 66 may preferably a screw, bolt, or other conventional fastener. In the embodiment shown, the third raised portion 60 has a circular shape, although other shapes and configurations are contemplated. The third raised portion 60 extends inward into the interior of the housing member 14. The third raised portion 60 may be formed by any conventional technique. For example, the third raised portion 60 may preferably be tooled into the bottom wall portion 62 of the housing member 14 by any of the conventional stamping methods.

Referring again to FIGS. 1, and 2, the housing member 14 may preferably include an alignment tab portion 70. In the embodiment shown, the alignment tab portion 70 is integrally formed with the housing member 14. Alternatively, the alignment tab portion 70 may be a separate member. The alignment tab portion 70 ensures that the circuit board 10 is aligned with the housing member 14. In the embodiment shown, the alignment tab portion 70 is positioned along a front edge portion 72 of the housing member 14. The alignment tab portion 70 may preferably extend outward substantially perpendicular from the bottom wall portion 62 of the housing member 14.

Referring to FIG. 1, the circuit board 10 may preferably include a notch portion 90. In the embodiment shown, the notch portion 90 is positioned along a second end 92 of the circuit board 10. As shown in FIG. 2, when the circuit board 10 is mounted to the housing member 14, the alignment tab portion 70 is received in the notch portion 90 of the circuit board 10. The circuit board 10 may also include an opening 91 through which the fastener 66 extends to fasten the circuit board 10 to the housing member 14.

Referring to FIGS. 1–6, the apparatus shown may be used to provide the automatic alignment of the circuit board 10 within the chassis 12. The circuit board 10 is positioned into the housing member 14. A first end 94 of the circuit board 10 is inserted through the opening 33 in the first flange portion 30 and through the opening 35 in the second flange portion 32 to guide the circuit board 10 toward the first and second raised portions 22, 24. The plurality of connectors 16, 17, 19, 21, 23 mounted on the circuit board 10 are received in the corresponding plurality of openings 20, 25, 27, 29, 31 in the end wall portion 18 of the housing member 14. The first end 94 of the circuit board 10 contacts the first and second raised portions 22, 24, (see FIG. 4) which provide automatic alignment of the circuit board 10 within the chassis 12. The alignment tab portion 70 is received in the notch portion 90 of the circuit board 10. The fastener 66 may be inserted through the opening 91 in the circuit board and the opening 64 in the third raised portion 60 to fasten the circuit board 10 to the housing member 14.

This arrangement has the advantage of providing for the automatic alignment of the circuit board 10 when it is positioned into the housing member 14. That is, the first and second raised portions 22 and 24 eliminate the need for a technician to manually align the circuit board 10 with the housing member 14. The first and second raised portions 22 and 24 ensure proper alignment between the circuit board 10 and the housing member 14 by preventing the circuit board 10 from sliding too far into the housing member 14. This in turn ensures that the connectors 16, 17, 19, 21, 23 on the circuit board 10 are proper aligned with the end wall portion 18. The first and second raised portions 22 and 24 also ensure that the opening 91 in the circuit board 10 is aligned with the opening 64 in the third raised portion 60 to allow a technician to quickly and easily fasten the circuit board 10 to the housing member 14. They also ensure that alignment tab portion 70 is aligned with the notch portion 90 of the circuit board 10 so that the alignment tab portion 70 can be received in the notch portion 90.

The first and second raised portions 22 and 24 also eliminate the need for gaskets between the end wall portion 18 and the circuit board 10. This eliminates the high costs associated with the gaskets, and the labor intensive process required to install the gaskets.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A method of providing automatic alignment of a circuit board within a chassis comprising the steps of:

providing a housing member, the housing member including an end wall portion, the end wall portion including a plurality of openings formed therein for receiving a plurality of connectors, the end wall portion further including a first raised portion and a second raised portion, a circuit board including a first end;

positioning the circuit board into the chassis; and contacting the first end of the circuit board with the first and second raised portions to provide automatic alignment of the circuit board within the chassis.

2. The method of claim 1 wherein the housing member includes a first flange portion including an opening aligned with the first raised portion and a second flange portion including an opening aligned with the second raised portion and further comprising the steps of:

inserting the first end of the circuit through the opening in the first flange portion and through the opening in the second flange portion to guide the circuit board.

3. The method of claim 1 further comprising the steps of:

fastening the circuit board to the housing member.

4. An apparatus for providing automatic alignment of a circuit board within a chassis comprising:

a housing member, the housing member including an end wall portion, the end wall portion including a plurality of openings formed therein for receiving a plurality of connectors, the end wall portion further including a first raised portion and a second raised portion to provide automatic alignment of the circuit board within the chassis.

5. The apparatus of claim 4 wherein the first raised portion is positioned adjacent a first end of the end wall portion and the second raised portion is positioned adjacent to a second end of the end wall portion.

6. The apparatus of claim 4 wherein the first and second raised portions each have a circular shape.

7. The apparatus of claim 4 wherein the first and second raised portions each extend inward into the housing member.

8. The apparatus of claim 4 wherein the housing member further includes a first flange portion including an opening formed therein aligned with the first raised portion and a second flange portion including an opening formed therein aligned with the second raised portion to receive and guide the circuit board.

9. The apparatus of claim 8 wherein the opening in the first flange portion comprises a slot and the opening in the second flange portion comprises a slot.

10. The apparatus of claim 8 wherein the housing member further includes a first sidewall portion and a second sidewall portion, the first flange portion extending outward substantially perpendicular from the first sidewall portion and the second flange portion extending outward substantially perpendicular from the second sidewall portion.

11. The apparatus of claim 10 wherein the first flange portion is positioned adjacent to an end of the first sidewall portion and the second flange portion is positioned adjacent to an end of the second sidewall portion.

12. The apparatus of claim 10 wherein the first sidewall portion includes a plurality of openings formed therein.

13. The apparatus of claim 10 wherein the second sidewall portion includes a plurality of openings formed therein.

14. The apparatus of claim 4 wherein the housing member further includes a third raised portion extending from a bottom wall portion of the housing member, the third raised portion including an opening formed therein for receiving a fastener to secure the circuit board to the housing member.

15. The apparatus of claim 14 wherein the third raised portion has a circular shape.

16. The apparatus of claim 14 wherein the third raised portion extends inward into the housing member.

17. The apparatus of claim 14 wherein the fastener comprising a screw.

18. The apparatus of claim 14 wherein the housing member includes an alignment tab portion to align a circuit board with the housing member.

19. The apparatus of claim 18 wherein the alignment tab portion is position along a front edge portion of the housing member.

20. The apparatus of claim 18 wherein the alignment tab portion extends outward substantially perpendicular from a bottom wall portion of the housing member.

21. The apparatus of claim 18 wherein in the circuit board includes a notch portion, the alignment tab portion received in the notch portion.

22. The apparatus of claim 21 wherein the notch portion is positioned along a second end of the circuit board.

23. The apparatus of claim 14 wherein the circuit board is fastened to the housing member.

24. The apparatus of claim 4 wherein the housing member is comprised of a single piece of conductive material.

25. An apparatus for providing automatic alignment of a circuit board comprising:

a housing member, the housing member including an end wall portion, the end wall portion including a plurality of openings formed therein for receiving a plurality of connectors, the end wall portion further including a first raised portion and a second raised portion, the first raised portion positioned adjacent a first end of the end wall portion and the second raised portion positioned adjacent a second end of the end wall portion, a circuit board positioned with the chassis including a first end, the first end of the circuit board contacting the first and second raised portion to provide automatic alignment of the circuit board within the chassis.

* * * * *